(12) United States Patent
Chyan et al.

(10) Patent No.: US 11,158,390 B2
(45) Date of Patent: Oct. 26, 2021

(54) METHOD AND APPARATUS FOR PERFORMING AUTOMATIC POWER CONTROL IN A MEMORY DEVICE WITH AID OF ASSOCIATED DETECTION DURING INITIALIZATION PHASE

(71) Applicant: Silicon Motion, Inc., Hsinchu County (TW)

(72) Inventors: Yu-Wei Chyan, Hsinchu (TW); Ping-Yen Tsai, Taoyuan (TW); Jiyun-Wei Lin, Hsinchu County (TW)

(73) Assignee: Silicon Motion, Inc., Hsinchu County (TW)

(*) Notice: Subject to any disclaimer, the term of this patent is extended or adjusted under 35 U.S.C. 154(b) by 21 days.

(21) Appl. No.: 16/833,686

(22) Filed: Mar. 30, 2020

(65) Prior Publication Data
US 2021/0104283 A1   Apr. 8, 2021

Related U.S. Application Data

(60) Provisional application No. 62/909,724, filed on Oct. 2, 2019.

(51) Int. Cl.
| | |
|---|---|
| *G11C 16/30* | (2006.01) |
| *G11C 16/32* | (2006.01) |
| *G06F 1/26* | (2006.01) |
| *G06F 3/06* | (2006.01) |

(52) U.S. Cl.
CPC .............. *G11C 16/30* (2013.01); *G06F 1/266* (2013.01); *G06F 3/0625* (2013.01); *G06F 3/0659* (2013.01); *G06F 3/0679* (2013.01); *G11C 16/32* (2013.01)

(58) Field of Classification Search
CPC ......... G11C 16/30; G11C 16/32; G06F 1/266; G06F 3/0659; G06F 3/0679; G06F 3/0625
USPC ........................................................ 711/103
See application file for complete search history.

(56) References Cited

U.S. PATENT DOCUMENTS

| | | | | |
|---|---|---|---|---|
| 8,605,519 | B2 * | 12/2013 | Sung ...................... | G11C 16/30 365/189.09 |
| 9,218,312 | B2 | 12/2015 | Park | |
| 10,644,580 | B2 * | 5/2020 | Nagamatsu ............ | H02M 1/14 |
| 2007/0008028 | A1 * | 1/2007 | Kawai .................... | H02M 3/07 327/536 |

(Continued)

*Primary Examiner* — Fernando Hidalgo
(74) *Attorney, Agent, or Firm* — Winston Hsu

(57) ABSTRACT

A method and apparatus for performing automatic power control in a memory device are provided. The method includes: during an initialization phase of the memory device, performing signal level detection on a reference clock request signal to determine whether the reference clock request signal is at a first predetermined voltage level or a second predetermined voltage level, for performing the automatic power control for the memory device, wherein the reference clock request signal is received through an IO pad; and according to a logic value carried by an input signal of a selective regulation circuit (SRC), performing selective power control to generate a secondary power voltage according to a main power voltage, wherein the selective power control makes the secondary power voltage be either equal to the main power voltage or a regulated voltage of the main power voltage in response to the logic value carried by the input signal.

20 Claims, 7 Drawing Sheets

(56) References Cited

U.S. PATENT DOCUMENTS

| | | | |
|---|---|---|---|
| 2012/0155168 A1* | 6/2012 | Kim | G11C 11/5628 365/185.03 |
| 2013/0042047 A1 | 2/2013 | Nishio | |
| 2020/0251907 A1* | 8/2020 | Hester | H02S 40/30 |
| 2021/0005237 A1* | 1/2021 | Gupta | G11C 11/161 |

* cited by examiner

METHOD AND APPARATUS FOR PERFORMING AUTOMATIC POWER CONTROL IN A MEMORY DEVICE WITH AID OF ASSOCIATED DETECTION DURING INITIALIZATION PHASE

CROSS REFERENCE TO RELATED APPLICATIONS

This application claims the benefit of U.S. provisional application No. 62/909,724, which was filed on Oct. 2, 2019, and is included herein by reference.

BACKGROUND OF THE INVENTION

1. Field of the Invention

The present invention is related to memory control, and more particularly, to a method and apparatus for performing automatic power control in a memory device (e.g. SD Express memory card, etc.), for example, with aid of associated detection during an initialization phase.

2. Description of the Prior Art

A memory device may comprise a Flash memory for storing data (e.g. user data), and the management of accessing the Flash memory is complicated. For example, the memory device may be a memory card conforming to Secure Digital (SD) specification and may be referred to as a SD memory card. Based on the architecture equipped with a 6-bit SD interface, the maximum of the data transmission rate of the SD memory card may reach 104 MB/sec. As the storage capacity becomes greater and greater due to the progress of the development, the data transmission rate seems to be insufficient. The related art tries to correct the problem, for example, by implementing the memory card with a different interface, but further problems are introduced. Thus, a novel method and associated architecture are needed for solving the problems without introducing any side effect or in a way that is less likely to introduce a side effect.

SUMMARY OF THE INVENTION

It is therefore an objective of the present invention to provide a method and apparatus for performing automatic power control in a memory device (e.g. SD Express memory card, etc.), for example, with aid of associated detection during an initialization phase, in order to solve the above-mentioned problems.

At least one embodiment of the present invention provides a method for performing automatic power control in a memory device. The memory device may comprise a non-volatile (NV) memory, and the NV memory may comprise at least one NV memory element (e.g. one or more NV memory elements). The method may comprise: during an initialization phase of the memory device, performing signal level detection on a reference clock request signal to determine whether the reference clock request signal is at a first predetermined voltage level or a second predetermined voltage level, for performing the automatic power control for the memory device, wherein the reference clock request signal is received from a host device through an input output (IO) pad of a transmission interface circuit within the memory device. For example, the signal level detection may comprise: performing a voltage division operation on a voltage of the reference clock request signal to convert the voltage into a divided voltage; comparing the divided voltage with a predetermined reference voltage level to generate a comparison result, wherein the comparison result indicates whether the reference clock request signal is at the first predetermined voltage level or the second predetermined voltage level; and latching the comparison result as a latched result, and generating a latch output signal carrying the latched result, for controlling a selective regulation circuit (SRC) of the transmission interface circuit through logic value setting. The method may further comprise: according to a logic value carried by an input signal of the SRC, performing selective power control to generate a secondary power voltage according to a main power voltage, wherein the main power voltage is obtained from the host device, and the selective power control makes the secondary power voltage be either equal to the main power voltage or a regulated voltage of the main power voltage in response to the logic value carried by the input signal of the SRC.

In addition to the above method, the present invention also provides a memory device, and the memory device comprises a NV memory and a controller. The NV memory is arranged to store information, wherein the NV memory may comprise at least one NV memory element (e.g. one or more NV memory elements). The controller is coupled to the NV memory, and the controller is arranged to control operations of the memory device. In addition, the controller comprises a processing circuit that is arranged to control the controller according to a plurality of host commands from a host device, to allow the host device to access the NV memory through the controller, and comprises a transmission interface circuit that is coupled to the processing circuit and arranged to perform communications with the host device for the memory device. For example, the transmission interface circuit may comprise an IO pad that is arranged to receive a reference clock request signal from the host device, a SRC that is arranged to perform selective power control, and a signal level detection circuit that is coupled to the IO pad and the SRC. The signal level detection circuit is arranged to perform signal level detection on the reference clock request signal during an initialization phase of the memory device, to determine whether the reference clock request signal is at a first predetermined voltage level or a second predetermined voltage level, for performing automatic power control for the memory device. More particularly, the signal level detection circuit may comprise a voltage divider, a comparator that is coupled to the voltage divider, and a latch device that is coupled to the comparator. The voltage divider is arranged to perform a voltage division operation on a voltage of the reference clock request signal to convert the voltage into a divided voltage. The comparator is arranged to compare the divided voltage with a predetermined reference voltage level to generate a comparison result, wherein the comparison result indicates whether the reference clock request signal is at the first predetermined voltage level or the second predetermined voltage level. The latch device is arranged to latch the comparison result as a latched result, and generate a latch output signal carrying the latched result, for controlling the SRC through logic value setting. For example, according to a logic value carried by an input signal of the SRC, the SRC performs the selective power control to generate a secondary power voltage according to a main power voltage, wherein the main power voltage is obtained from the host device, and the selective power control makes the secondary power voltage be either equal to the main power voltage or a regulated voltage of the main power voltage in response to the logic value carried by the input signal of the SRC.

According to some embodiments, an associated electronic device is also provided. The electronic device may comprise the above memory device, and may further comprise: the host device, coupled to the memory device. The host device may comprise: at least one processor, arranged for controlling operations of the host device; and a power supply circuit, coupled to the at least one processor, arranged for providing power to the at least one processor and the memory device. In addition, the memory device may provide the host device with storage space.

In addition to the above method, the present invention also provides a controller of a memory device, where the memory device comprises the controller and a NV memory. The NV memory may comprise at least one NV memory element (e.g. one or more NV memory elements). In addition, the controller comprises a processing circuit that is arranged to control the controller according to a plurality of host commands from a host device, to allow the host device to access the NV memory through the controller, and comprises a transmission interface circuit that is coupled to the processing circuit and arranged to perform communications with the host device for the memory device. For example, the transmission interface circuit may comprise an IO pad that is arranged to receive a reference clock request signal from the host device, a SRC that is arranged to perform selective power control, and a signal level detection circuit that is coupled to the IO pad and the SRC. The signal level detection circuit is arranged to perform signal level detection on the reference clock request signal during an initialization phase of the memory device, to determine whether the reference clock request signal is at a first predetermined voltage level or a second predetermined voltage level, for performing automatic power control for the memory device. More particularly, the signal level detection circuit may comprise a voltage divider, a comparator that is coupled to the voltage divider, and a latch device that is coupled to the comparator. The voltage divider is arranged to perform a voltage division operation on a voltage of the reference clock request signal to convert the voltage into a divided voltage. The comparator is arranged to compare the divided voltage with a predetermined reference voltage level to generate a comparison result, wherein the comparison result indicates whether the reference clock request signal is at the first predetermined voltage level or the second predetermined voltage level. The latch device is arranged to latch the comparison result as a latched result, and generate a latch output signal carrying the latched result, for controlling the SRC through logic value setting. For example, according to a logic value carried by an input signal of the SRC, the SRC performs the selective power control to generate a secondary power voltage according to a main power voltage, wherein the main power voltage is obtained from the host device, and the selective power control makes the secondary power voltage be either equal to the main power voltage or a regulated voltage of the main power voltage in response to the logic value carried by the input signal of the SRC.

The present invention method and associated apparatus can guarantee that the memory device can operate properly in various situations. For example, the method provides multiple control schemes for automatic power control. In addition, with aid of associated detection during the initialization phase, the SRC may provide the aforementioned at least one IO cell with the IO power of correct voltage level, and the memory device and the memory controller will not suffer from unnecessary optional design such as additional bonding pad, additional IO pad, etc.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
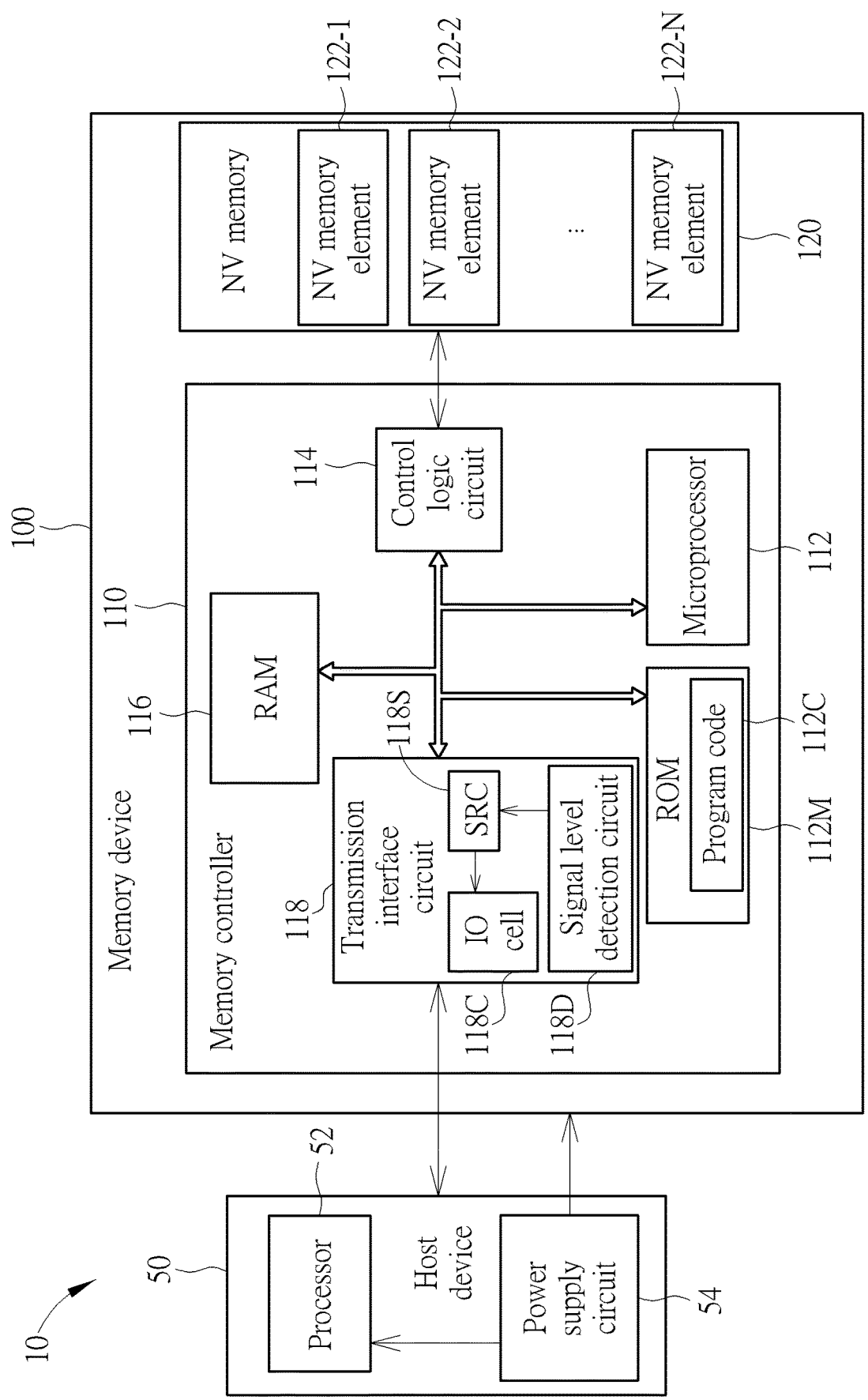
FIG. 1 is a diagram of an apparatus for performing automatic power control in a memory device according to an embodiment of the present invention.

Embodiments of the present invention provide a method and apparatus for performing automatic power control in a memory device (e.g. SD Express memory card, etc.), for example, with aid of associated detection during an initialization phase. For better comprehension, the apparatus may comprise at least one portion (e.g. a portion or all) of an electronic device 10 shown in FIG. 1, but the present invention is not limited thereto.

The electronic device 10 may comprise a host device 50 and a memory device 100, where the memory device 100 may be taken as an example of the memory device mentioned above. The host device 50 may comprise at least one processor (e.g. one or more processors) which may be collectively referred to as the processor 52, and may further comprise a power supply circuit 54 that is coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a portable memory device (e.g. a memory card conforming to the SD/MMC, CF, MS or XD specification), a solid state drive (SSD), and various types of embedded memory devices conforming to the UFS and eMMC specifications, respectively. According to this embodiment, the memory device 100 may comprise a controller such as a memory controller 110, and may further comprise a non-volatile (NV) memory 120, where the controller is arranged to control operations of the memory device 100 and access the NV memory 120, and the NV memory 120 is arranged to store information. The NV memory 120 may comprise at least one NV memory element (e.g. one or more NV memory elements), such as a plurality of NV memory elements 122-1, 122-2, . . . , and 122-N, where "N" may represent a positive integer that is greater than one. For example, the NV memory 120 may be a flash memory, and the plurality of NV memory elements 122-1, 122-2, . . . , and 122-N may be a plurality of flash memory chips or a plurality of flash memory dies, but the present invention is not limited thereto.

As shown in FIG. 1, the memory controller 110 may comprise a processing circuit such as a microprocessor 112, a storage unit such as a read-only memory (ROM) 112M, a control logic circuit 114, a random access memory (RAM) 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the read-only memory 112M of this embodiment is arranged to store a program code 112C, and the microprocessor 112 is arranged to execute the program code 112C to control the access of the flash memory 120. Note that, in some examples, the program code 112C may be stored in the RAM 116 or any type of memory. Further, a data protection circuit (not shown) in the control logic circuit 114 may protect data and/or perform error correction, and the transmission interface circuit 118 may conform to a specific communications specification (e.g. the Serial Advanced Technology Attachment (SATA) specification, Universal Serial Bus (USB) specification, Peripheral Component Interconnect Express (PCIe) specification, embedded Multi Media Card (eMMC) specification, or Universal Flash Storage (UFS) specification), and may perform communications according to the specific communications specification, for example, perform communications with the host device 50 for the memory device 100.

More particularly, the transmission interface circuit 118 may conform to a newer communications specification such as Secure Digital (SD) 7.0 specification, etc. and may focus on communications of a higher speed, and may be compatible to multiple communications specifications such as PCIe specification, SD 6.0 specification, etc. The transmission interface circuit 118 may comprise multiple sub-circuits, and the multiple sub-circuits may comprise a physical layer (PHY) circuit (e.g. a PCIe PHY circuit) that supports communications corresponding to a first communications protocol (e.g. the PCIe protocol), and may further comprise an automatic power control circuit for performing automatic power control. For example, the host device 50 may support communications corresponding to the first communications protocol, and the transmission interface circuit 118 may perform communications with the host device 50 through the PHY circuit. For another example, the host device 50 may support communications corresponding to a second communications protocol, rather than the first communications protocol, and the transmission interface circuit 118 may perform communications with the host device 50 without using the PHY circuit. In addition, the automatic power control circuit may comprise a signal level detection circuit 118D, a selective regulation circuit (SRC) 118S, and at least one input output (IO) cell (e.g. one or more IO cells) such as the IO cell 118C, where the aforementioned at least one IO cell may comprise a plurality of IO cells {118C} respectively corresponding to a plurality of IO pads of the transmission interface circuit 118, and any of the plurality of IO cells {118C} (e.g. the IO cell 118C) may be arranged to convert an external signal at a corresponding IO pad of the plurality of IO pads into an internal signal of the memory controller 110 or convert the internal signal into the external signal at the corresponding IO pad, but the present invention is not limited thereto. The memory controller 110 may utilize the signal level detection circuit 118D to perform signal level detection on a certain signal (e.g. CLKREQ#) between the host device 50 and the memory device 100 at the corresponding terminal during the initialization phase of the memory device 100, for automatically controlling at least one IO power of the aforementioned at least one IO cell. For example, according to the signal level detection, the memory controller 110 may utilize the SRC 118S to automatically select a corresponding voltage level from multiple candidate voltage levels (e.g. 3.3 V and 1.8 V) and output the corresponding voltage level (e.g. 3.3 V or 1.8 V) as the IO power. As a result, related art problems (e.g. unnecessary optional design such as additional bonding pad, additional IO pad, etc.) can be prevented.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the NV memory 120 with the operating commands to perform reading, writing/programming, etc. on memory units (e.g. data pages) having physical addresses within the flash memory 120, where the physical addresses correspond to the logical addresses.

Figure 2:
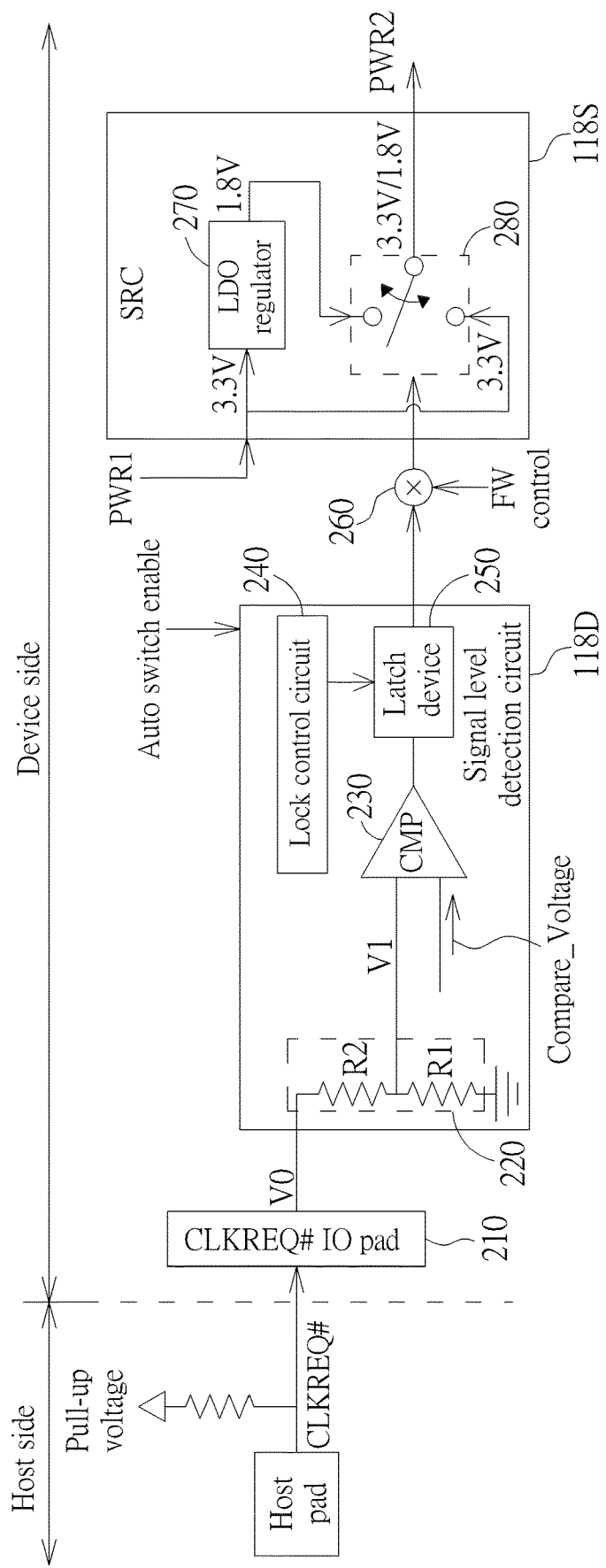
FIG. 2 illustrates some implementation details of the apparatus shown in FIG. 1 according to an embodiment of the present invention.

FIG. 2 illustrates some implementation details of the apparatus shown in FIG. 1 according to an embodiment of the present invention. The host side and the device side correspond to the host device 50 and the memory device 100, respectively. The host device 50 may comprise a transmission interface circuit conforming to one or more communications specifications (e.g. the specific communications specification), for performing communications with the memory device 100, and this transmission interface circuit may comprise a set of IO pads such as a host pad at the host side shown in FIG. 2, and may further comprise a set of pull-up resistors such as the pull-up resistor next to the host pad. For example, when the host device 50 start powering up the memory device 100, the pull-up voltage may pull up the reference clock request signal CLKREQ# at the host pad through the pull-up resistor by default. At the device side shown in FIG. 2, an IO pad 210 for transmitting the reference clock request signal CLKREQ# (labeled "CLKREQ# IO pad" in FIG. 2, for better comprehension) may be taken as an example of the corresponding IO pad mentioned above. The signal level detection circuit 118D may comprise a voltage divider 220, a comparator 230 (labeled "CMP" in FIG. 2, for brevity), a lock control circuit 240, and a latch device 250. For example, the voltage divider 220 may comprise a set of resistors R1 and R2 respectively having predetermined resistance values R1 and R2 (respectively indicated by italics of the same symbols for better comprehension), and the latch device 250 may be implemented with a D-type latch, an RS latch, etc. In addition, the SRC 118S may be coupled to the signal level detection circuit 118D through a logic unit 260 such as at least one logic gate (e.g. one or more logic gates), and may comprise a regulator such as a low dropout (LDO) regulator 270 and a switch circuit 280, where the switch circuit 280 may comprise at least one switch (e.g. one or more switches).

For better comprehension, when the reference clock request signal CLKREQ# is pulled up, a voltage V0 of the reference clock request signal CLKREQ# may be at a first predetermined voltage level such as 3.3 V (Volt) or a second predetermined voltage level such as 1.8 V, depending on a certain operation mode that the host device 50 supports, but the present invention is not limited thereto. The signal level detection circuit 118D may perform signal level detection on the reference clock request signal CLKREQ# to determine whether the reference clock request signal CLKREQ# is at the first predetermined voltage level (e.g. 3.3 V) or the second predetermined voltage level (e.g. 1.8 V), for performing automatic power control for the memory device 100. The voltage divider 220 may perform a voltage division operation on the voltage V0 of the reference clock request signal CLKREQ# to convert the voltage V0 into a divided voltage V1 at the node between the resistors R1 and R2. For example, V1=(R1/(R1+R2))*V0. As shown in FIG. 2, the comparator 230 may compare the divided voltage V1 with a predetermined reference voltage level Compare_Voltage to generate a comparison result, and the comparison result may indicate whether the divided voltage V1 reaches (e.g. greater than or equal to) the predetermined reference voltage level Compare_Voltage, and more particularly, may indicate whether the voltage V0 reaches (e.g. greater than or equal to) a predetermined threshold voltage level Vth, and therefore may indicate whether the reference clock request signal CLKREQ# is at the first predetermined voltage level (e.g. 3.3 V) or the second predetermined voltage level (e.g. 1.8 V). For example, Vth=((R1+R2)/R1)*Compare_Voltage). Assume that Vth=2.55 V and the predetermined reference voltage level Compare_Voltage is a certain reference voltage generated by a reference voltage generator, the predetermined resistance values R1 and R2 of the resistors R1 and R2 may be properly designed to guarantee the correctness of the signal level detection regarding the reference clock request signal CLKREQ#.

Under control of the lock control circuit 240, the latch device 250 may latch a comparator output signal of the comparator 230, such as the comparator output signal carrying the comparison result, to latch the comparison result as a latched result and generate a latch output signal carrying the latched result. For example, a high voltage level and a low voltage level of the comparator output signal may respectively represent logic values 1 and 0, for indicating a first condition that the voltage V0 reaches the predetermined threshold voltage level Vth (e.g. the reference clock request signal CLKREQ# is at the first predetermined voltage level such as 3.3 V) and a second condition that the voltage V0 does not reach the predetermined threshold voltage level Vth (e.g. the reference clock request signal CLKREQ# is at the second predetermined voltage level such as 1.8 V), respectively, but the present invention is not limited thereto. As the latched result carried by the latch output signal may represent the comparison result at the moment when the latch device 250 latches the comparator output signal, a high voltage level and a low voltage level of the latch output signal may respectively represent the logic values 1 and 0 for indicating the first condition and the second condition, respectively. In addition, the logic unit 260 may bypass the logic values 1 or 0 of the latch output signal, or allow the microprocessor 112 to forcibly set one of the logic values 1 and 0 when there is a need. More particularly, the memory controller 110 (e.g. the microprocessor 112) may enable the signal level detection circuit 118D (labeled "Auto switch enable" in FIG. 2, for better comprehension), for example, through an enable signal carrying an enable state (e.g. the logic value 1 thereof), and the logic unit 260 may bypass the logic values 1 or 0 of the latch output signal to the SRC 118S, but the present invention is not limited thereto. For example, the memory controller 110 (e.g. the microprocessor 112) may enable the signal level detection circuit 118D through the enable signal carrying the enable state (e.g. the logic value 1 thereof), and may utilize the logic unit 260 to replace the logic values 1 or 0 of the latch output signal with the logic values 1 or 0 based on one or more rules such as firmware control rules (labeled "FW control" in FIG. 2, for better comprehension), and more particularly, with reference to the latched result. In another example, the memory controller 110 (e.g. the microprocessor 112) may disable the signal level detection circuit 118D, for example, through the enable signal carrying a disable state (e.g. the logic value 0 thereof), and may utilize the logic unit 260 to set the logic values 1 or 0 based on the one or more rules such as the firmware control rules.

As the logic unit 260 may be arranged to provide the memory controller 110 with a control path of controlling the SRC 118S according to the one or more rules, implementation of the logic unit 260 may vary depending on various designs. Examples of the aforementioned at least one logic gate of the logic unit 260 may include, but are not limited to: OR gate, exclusive-OR (XOR) gate, AND gate, etc. As shown in FIG. 2, the SRC 118S may operate according to the output of the logic unit 260, such as the logic values 1 or 0 of the latch output signal. More particularly, the SRC 118S may selectively bypass a main power voltage PWR1 (e.g. 3.3 V) obtained from the host device 50 or perform voltage regulation on the main power voltage PWR1, to generate a secondary power voltage PWR2 (e.g. 3.3 V or 1.8V) as the IO power of the aforementioned at least one IO cell (e.g. the IO cell 118C), where the LDO regulator 270 may perform the voltage regulation on the main power voltage PWR1 to generate a regulated voltage (e.g. 1.8 V) for being selected. For example, when the output of the logic unit 260 carries the logic value 1 (e.g. this output is at the high voltage level thereof), the switch circuit 280 may select the main power voltage PWR1 as the secondary power voltage PWR2. For another example, when the output of the logic unit 260 carries the logic value 0 (e.g. this output is at the low voltage level thereof), the switch circuit 280 may select the regulated voltage (e.g. 1.8 V) generated by the LDO regulator 270 as the secondary power voltage PWR2.

According to some embodiments, the main power voltage PWR1 may be implemented with one of multiple driving voltages VDD1, VDD2, etc., such as the driving voltage VDD1, but the present invention is not limited thereto.

Figure 3:
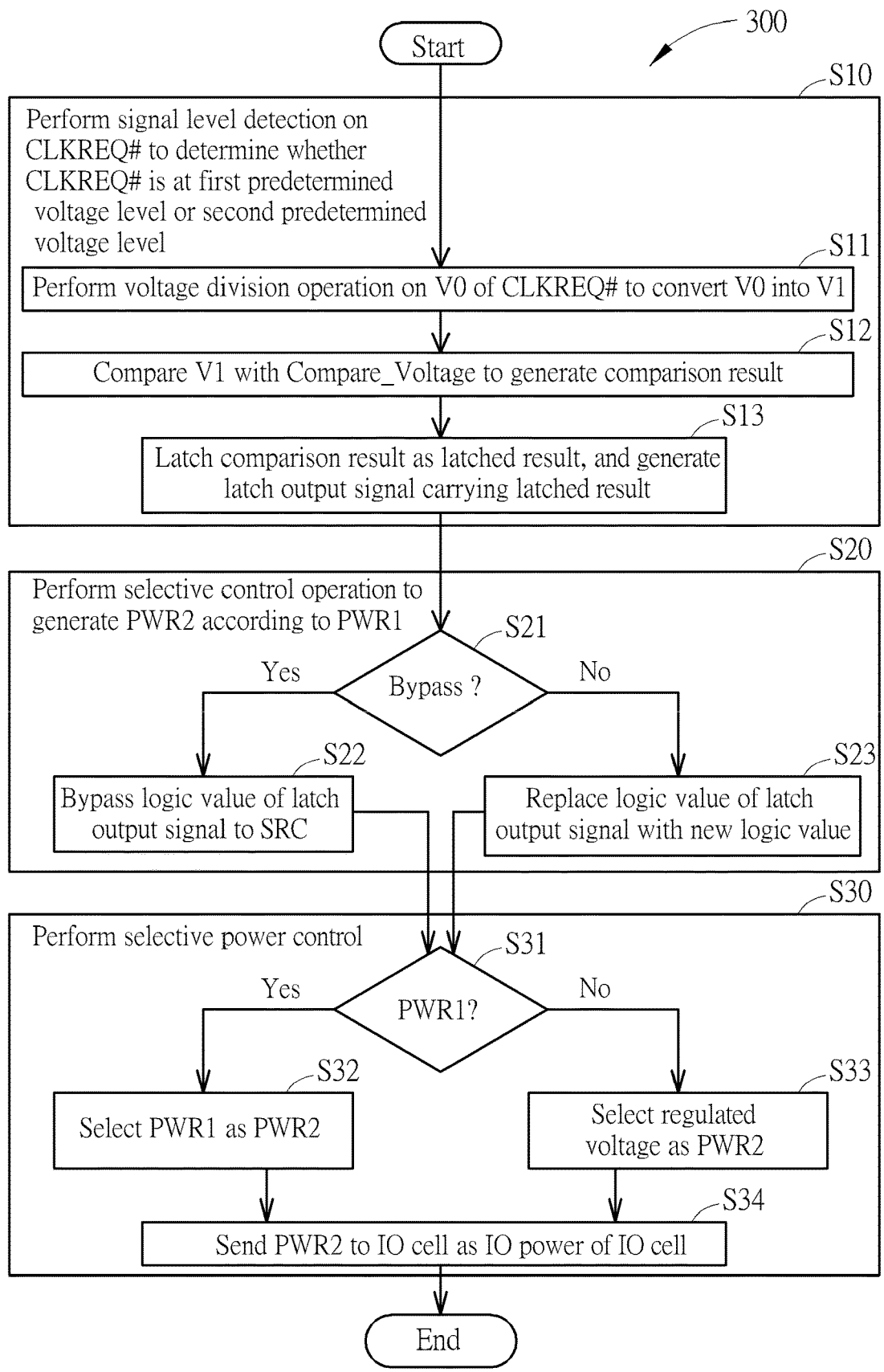
FIG. 3 is a working flow of a method for performing automatic power control in a memory device according to an embodiment of the present invention.

FIG. 3 is a working flow 300 of the method for performing automatic power control in a memory device according to an embodiment of the present invention, where the method can be applied to the controller such as the memory controller 110, the memory device 100, and the electronic device 10 at which the memory device 100 is installed.

In Step S10, during the initialization phase of the memory device 100, the memory controller 110 (e.g. the signal level detection circuit 118D) may perform the signal level detection on the reference clock request signal CLKREQ# to determine whether the reference clock request signal CLKREQ# is at the first predetermined voltage level (e.g. 3.3 V) or the second predetermined voltage level (e.g. 1.8 V), for performing the automatic power control for the memory device 100. For example, the reference clock request signal CLKREQ# may be received from the host device 50 through the IO pad 210 of the transmission interface circuit 118, and the IO pad 210 may be regarded as a terminal of the memory device 100, such as one of multiple terminals of the transmission interface circuit 118.

In Step S11, the memory controller 110 (e.g. the voltage divider 220) may perform a voltage division operation on the voltage V0 of the reference clock request signal CLKREQ# to convert the voltage V0 into the divided voltage V1 at the node between the resistors R1 and R2 of the voltage divider 220.

In Step S12, the memory controller 110 (e.g. the comparator 230) may compare the divided voltage V1 with the predetermined reference voltage level Compare_Voltage to generate a comparison result, where the comparison result may indicate whether the voltage V0 reaches (e.g. greater than or equal to) the predetermined threshold voltage level Vth, and therefore may indicate whether the reference clock request signal CLKREQ# is at the first predetermined voltage level (e.g. 3.3 V) or the second predetermined voltage level (e.g. 1.8 V).

In Step S13, the memory controller 110 (e.g. the latch device 250) may latch the comparison result as the latched result, for example, through latching the comparator output signal of the comparator 230 that carry the comparison result, and generate the latch output signal carrying the latched result, for controlling the SRC 118S of the transmission interface circuit 118 through logic value setting.

In Step S20, based on internal control of the memory controller 110, such as the control of the microprocessor 112, the memory controller 110 (e.g. the logic unit 260) may perform a selective control operation.

In Step S21, according to a control signal of the memory controller 110 within the memory device 100, such as the control signal generated by the microprocessor 112 for being input into a control input terminal (e.g. the lower input terminal) of the logic unit 260, the memory controller 110 (e.g. the logic unit 260) may determine whether to bypass the logic values 1 or 0 of the latch output signal to the SRC 118S of the transmission interface circuit 118. If Yes, Step S22 is entered; if No, Step S23 is entered.

In Step S22, the memory controller 110 (e.g. the logic unit 260) may bypass the logic values 1 or 0 of the latch output signal to the SRC 118S, for being used as the logic value carried by the input signal of the SRC 118S.

In Step S23, the memory controller 110 (e.g. the logic unit 260) may replace the logic values 1 or 0 of the latch output signal with a new logic value carried by the control signal (e.g. the logic value determined by the microprocessor 112, such as the logic values 1 or 0 based on the one or more rules such as the firmware control rules), for being used as the logic value carried by the input signal of the SRC 118S, to allow the microprocessor 112 to forcibly set one of the logic values 1 and 0 to the SRC 118S.

In Step S30, according to the logic value carried by the input signal of the SRC 118S, the memory controller 110 (e.g. the SRC 118S) may perform selective power control to generate the secondary power voltage PWR2 according to the main power voltage PWR1, and more particularly, determine whether to bypass the main power voltage PWR1 (e.g. 3.3 V) obtained from the host device 50, to generate the secondary power voltage PWR2 (e.g. 3.3 V or 1.8V) as the IO power of the aforementioned at least one IO cell (e.g. the IO cell 118C), where the selective power control makes the secondary power voltage PWR2 be either equal to the main power voltage PWR1 or the regulated voltage of the main power voltage PWR1 in response to the logic value carried by the input signal of the SRC 118S.

In Step S31, according to the logic value carried by the input signal of the SRC 118S, the memory controller 110 (e.g. the switch circuit 280 in the SRC 118S) may determine whether to select the main power voltage PWR1 (e.g. 3.3 V) as the secondary power voltage PWR2. If Yes (e.g. the input signal of the SRC 118S carries the logic value 1, and more particularly, this input signal is at the high voltage level thereof), Step S32 is entered; if No (e.g. the input signal of the SRC 118S carries the logic value 0, and more particularly, this input signal is at the low voltage level thereof), Step S33 is entered.

In Step S32, the memory controller 110 (e.g. the switch circuit 280 in the SRC 118S) may select the main power voltage PWR1 (e.g. 3.3 V) as the secondary power voltage PWR2.

In Step S33, the memory controller 110 (e.g. the switch circuit 280 in the SRC 118S) may select the regulated voltage (e.g. 1.8 V) generated by the LDO regulator 270 as the secondary power voltage PWR2.

In Step S34, the memory controller 110 (e.g. the SRC 118S) may send the secondary power voltage PWR2 to the aforementioned at least one IO cell (e.g. one or more IO cells, such as the IO cell 118C or the plurality of IO cells {118C}) as the IO power of the aforementioned at least one IO cell (e.g. the IO cell 118C or the plurality of IO cells {118C}), to make the aforementioned at least one IO cell (e.g. the IO cell 118C or the plurality of IO cells {118C}) operate according to the secondary power voltage PWR2.

Based on the working flow 300, the architecture shown in FIG. 1 (e.g. the automatic power control circuit comprising the signal level detection circuit 118D, the SRC 118S, and the aforementioned at least one IO cell such as the IO cell 118C or the plurality of IO cells {118C}, and more particularly, the architecture in the device side as shown in FIG. 2) can perform the automatic power control with ease, having no need to be equipped with unnecessary optional design such as additional bonding pad, additional IO pad, etc., and the apparatus (e.g. the electronic device 10, the memory device 100, the memory controller 110, etc.) can properly perform the signal conversion between the set of external signals in the external voltage range and the set of corresponding internal signals of the transmission interface circuit 118 in the internal voltage range, to allow the memory device 100 to operate correctly, As a result, the related art problem can be solved without introducing any side effect or in a way that is less likely to introduce a side effect.

For better comprehension, the method may be illustrated with the working flow 300, but the present invention is not limited thereto. According to some embodiments, one or more steps may be added, deleted, or changed in the working flow 300.

According to some embodiments, the working flow 300 may be repeated for multiple times of boot-up of the memory device 100. For example, the respective determination results of Steps S21 and S31 may be Yes and Yes, respectively, for one of the multiple times; the respective determination results of Steps S21 and S31 may be Yes and No, respectively, for another of the multiple times; the respective determination results of Steps S21 and S31 may be No and Yes, respectively, for another of the multiple times; and the respective determination results of Steps S21 and S31 may be No and No, respectively, for another of the multiple times. For brevity, similar descriptions for these embodiments are not repeated in detail here.

According to some embodiments, the automatic power control may be performed according to the signal level detection of the reference clock request signal CLKREQ# received through the IO pad 210, rather than respective signal level detection of multiple signals received from the host device 50 through the plurality of IO pads of the transmission interface circuit 118. For example, in Step 34, the memory controller 110 (e.g. the SRC 118S) may send the secondary power voltage PWR2 to the IO cell 118C as the IO power of the IO cell 118C, to make the IO cell 118C operate according to the secondary power voltage PWR2, where the IO pad 210 is positioned in the IO cell 118C. More particularly, in Step 34, the memory controller 110 (e.g. the SRC 118S) may send the secondary power voltage PWR2 to the plurality of IO cells {118C} as the IO power of the plurality of IO cells {118C}, to make the plurality of IO cells {118C} operate according to the secondary power voltage PWR2, where the IO cell 118 is one of the plurality of IO cells {118C}. For brevity, similar descriptions for these embodiments are not repeated in detail here.

Figure 4:
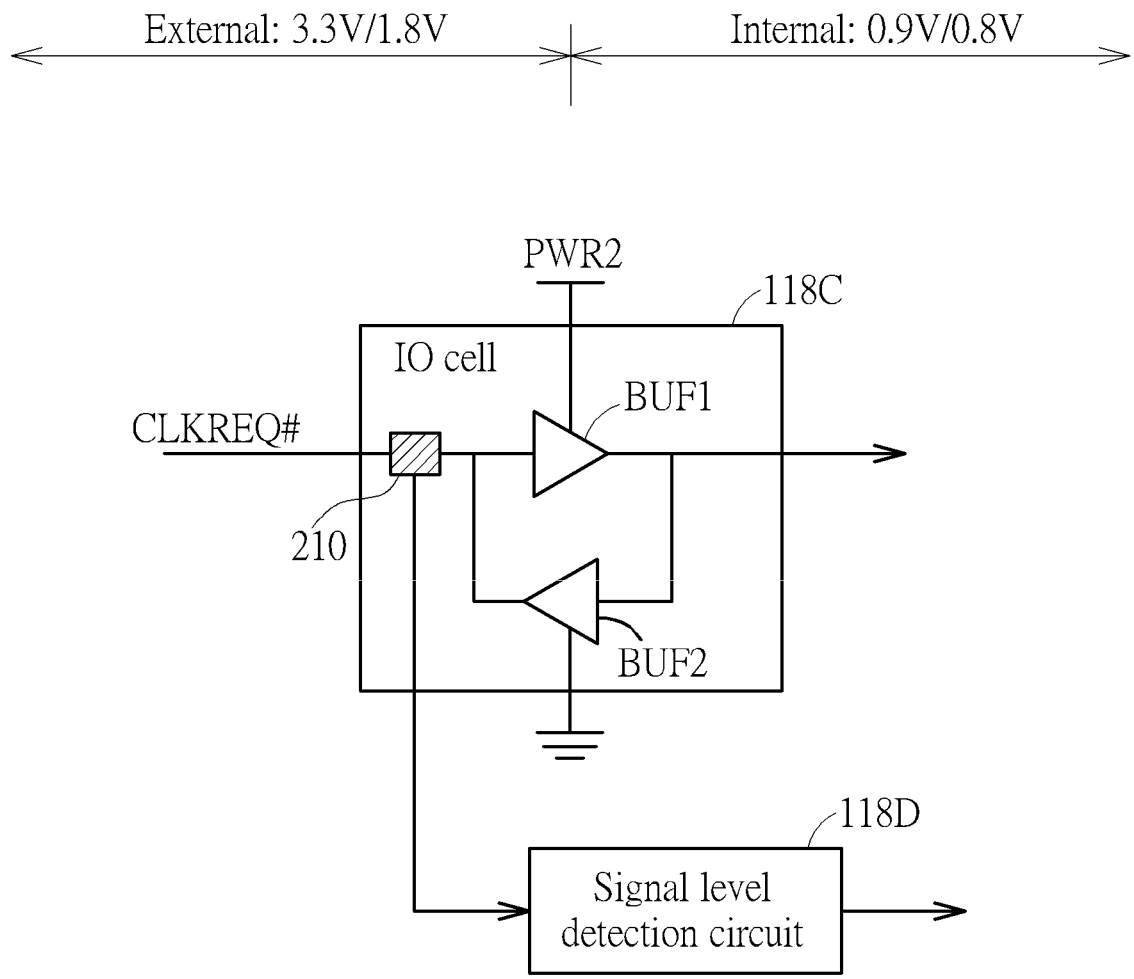
FIG. 4 illustrates an example of an IO cell.

FIG. 4 illustrates an example of the IO cell 118C. In addition to the IO pad 210, the IO cell 118C may further comprise a set of buffers BUF1 and BUF2, where the buffer BUF1 is on a receiving path and the buffer BUF2 is on a transmitting path. The IO cell 118C may perform signal conversion through the buffers BUF1 and BUF2. The buffer BUF1 may convert an external signal (e.g. the reference clock request signal CLKREQ# at the IO pad 210) corresponding to an external voltage range into an internal signal (e.g. a logic signal) corresponding to an internal voltage range, and the buffer BUF2 may convert the internal signal corresponding to an internal voltage range into the external signal corresponding to an external voltage range. For example, the external voltage range may be [0, 3.3] (V) or [0, 1.8] (V) (labeled "External: 3.3V/1.8V" in FIG. 4 for brevity), depending on the design of the host device 50 (e.g. the transmission interface circuit thereof), and the memory controller 110 (more particularly, the architecture at the device side as shown in FIG. 2) may adaptively switch the voltage level of the secondary power voltage PWR2 at the initialization phase to make the IO cell 118C properly perform the signal conversion, to allow the memory device 100 to operate correctly. Additionally, the internal voltage range may be determined in advance in a design phase of the memory controller 110, and more particularly, may be [0, 0.9] (V) or [0, 0.8] (V) (labeled "Internal: 0.9V/0.8V" in FIG. 4 for brevity), depending on the design of the hardware architecture of the memory controller 110, but the present invention is not limited thereto. For example, when the 28 nm process is applied to implementing the hardware architecture of the memory controller 110, the internal voltage range may be [0, 0.9] (V). For another example, when the 16 nm process is applied to implementing the hardware architecture of the memory controller 110, the internal voltage range may be [0, 0.8] (V), In this embodiment, the buffers BUF1 and BUF2 may be implemented with level shifters, but the present invention is not limited thereto.

According to some embodiments, the memory controller 110 (more particularly, the architecture at the device side as shown in FIG. 2) may adaptively switch the voltage level of the secondary power voltage PWR2 at the initialization phase to make the plurality of IO cells {118C} properly perform the signal conversion between a set of external signals in the external voltage range and a set of corresponding internal signals of the transmission interface circuit 118 in the internal voltage range, to allow the memory device 100 to operate correctly, where the set of external signals may be transmitted between the plurality of IO pads of the transmission interface circuit 118 and the set of IO pads (e.g. host pads) at the host side, but the present invention is not limited thereto. Examples of the set of external signals may include, but are not limited to: the reference clock request signal CLKREQ#, a reset signal PERST#, and a command signal CMD.

Figure 5:
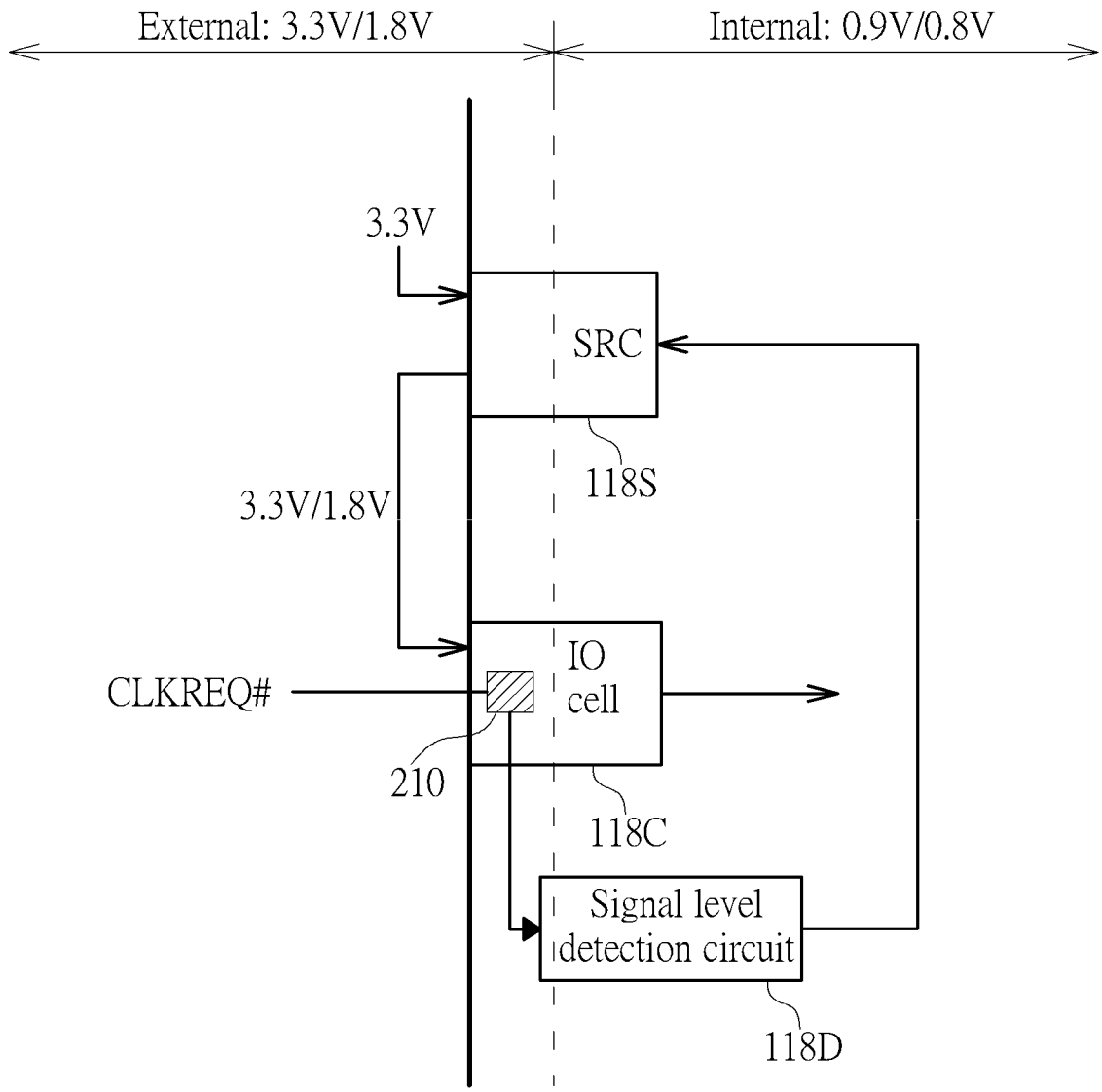
FIG. 5 illustrates a first control scheme of the method for performing automatic power control in a memory device according to an embodiment of the present invention.

FIG. 5 illustrates a first control scheme of the method for performing automatic power control in the memory device according to an embodiment of the present invention. As shown in FIG. 5, the main power voltage PWR1 obtained from the host device 50 may be equal to 3.3 V, and the secondary power voltage PWR2 obtained from the SRC 118S may be equal to 3.3 V or 1.8 V, depending on the automatic power control performed by the present invention apparatus. By utilizing the signal level detection circuit 118D, the apparatus (e.g. the electronic device 10, the memory device 100, the memory controller 110, etc.) may automatically determine whether which of the first condition and the second condition is satisfied, and therefore may automatically determine whether the reference clock request signal CLKREQ# is at the first predetermined voltage level such as 3.3 V or at the second predetermined voltage level such as 1.8 V, to correctly generate the secondary power voltage PWR2 as the IO power for the aforementioned at least one IO cell (e.g. the IO cell 118C or the plurality of IO cells {118C}).

Figure 6:
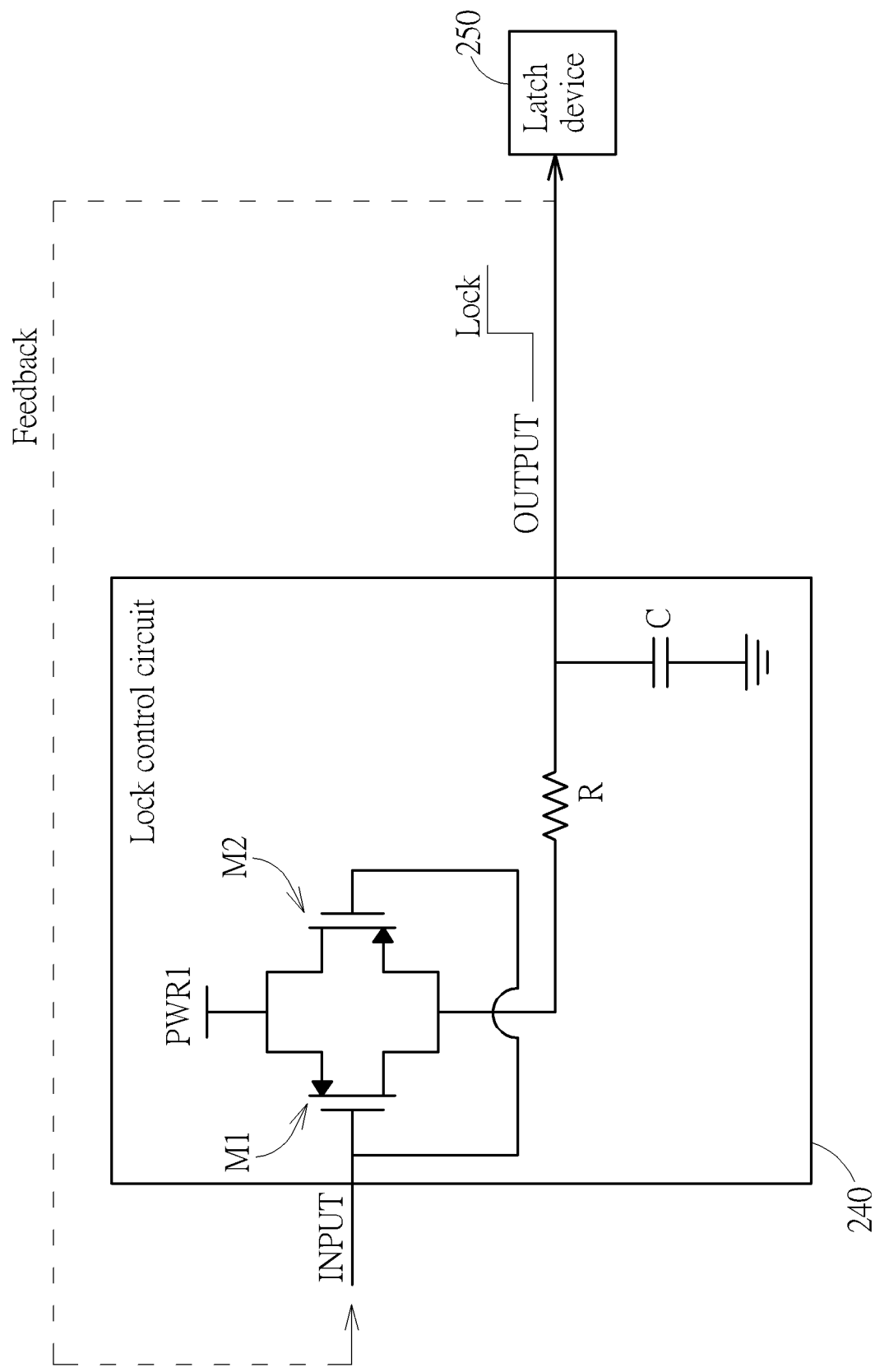
FIG. 6 illustrates a second control scheme of the method for performing automatic power control in the memory device according to an embodiment of the present invention.

FIG. 6 illustrates a second control scheme of the method for performing automatic power control in the memory device according to an embodiment of the present invention. The lock control circuit 240 may comprise a set of transistors M1 and M2 corresponding to the same type, a resistor R having a predetermined resistance value R and a capacitor C having a predetermined capacitance value C (respectively indicated by italics of the same symbols for better comprehension). For example, the transistors M1 and M2 may be implemented with Metal Oxide Semiconductor Field Effect Transistor (MOSFETs) such as P-type MOSFETs (PMOSFETs), but the present invention is not limited thereto. Regarding an RC circuit formed with the resistor R and the capacitor C, the time constant of the RC circuit may correspond to the product (R*C) of the predetermined resistance value R and the predetermined capacitance value C. As shown in FIG. 6, the transistors M1 and M2 may be coupled to each other to form a current mirror. During the initialization phase of the memory device 100, the main power voltage PWR1 obtained from the host device 50 may be pulled up from 0 V to 3.3 V to activate the lock control circuit 240, and a current flowing through the current mirror may pass the resistor R and charge the capacitor C to pull up the output signal OUTPUT of the lock control circuit 240 from a low voltage level to a high voltage level after a predetermined time period (which may correspond to the time constant of the RC circuit) since the lock control circuit 240 is activated, where the high voltage level of the output signal OUTPUT may represent a lock state (labeled "Lock" in FIG. 6, for brevity). As a result, the lock control circuit 240 may trigger the latch device 250 to latch the comparator output signal carrying the comparison result, and more particularly, latch the comparison result as the latched result and generate the latch output signal carrying the latched result. Afterward, a feedback signal (labeled "Feedback" in FIG. 6, for brevity) corresponding to the output signal OUTPUT may be arranged to turn off at least one portion (e.g. a portion or all) of the lock control circuit 240, for example, through the input signal INPUT, in order to save power, but the present invention is not limited thereto.

Figure 7:
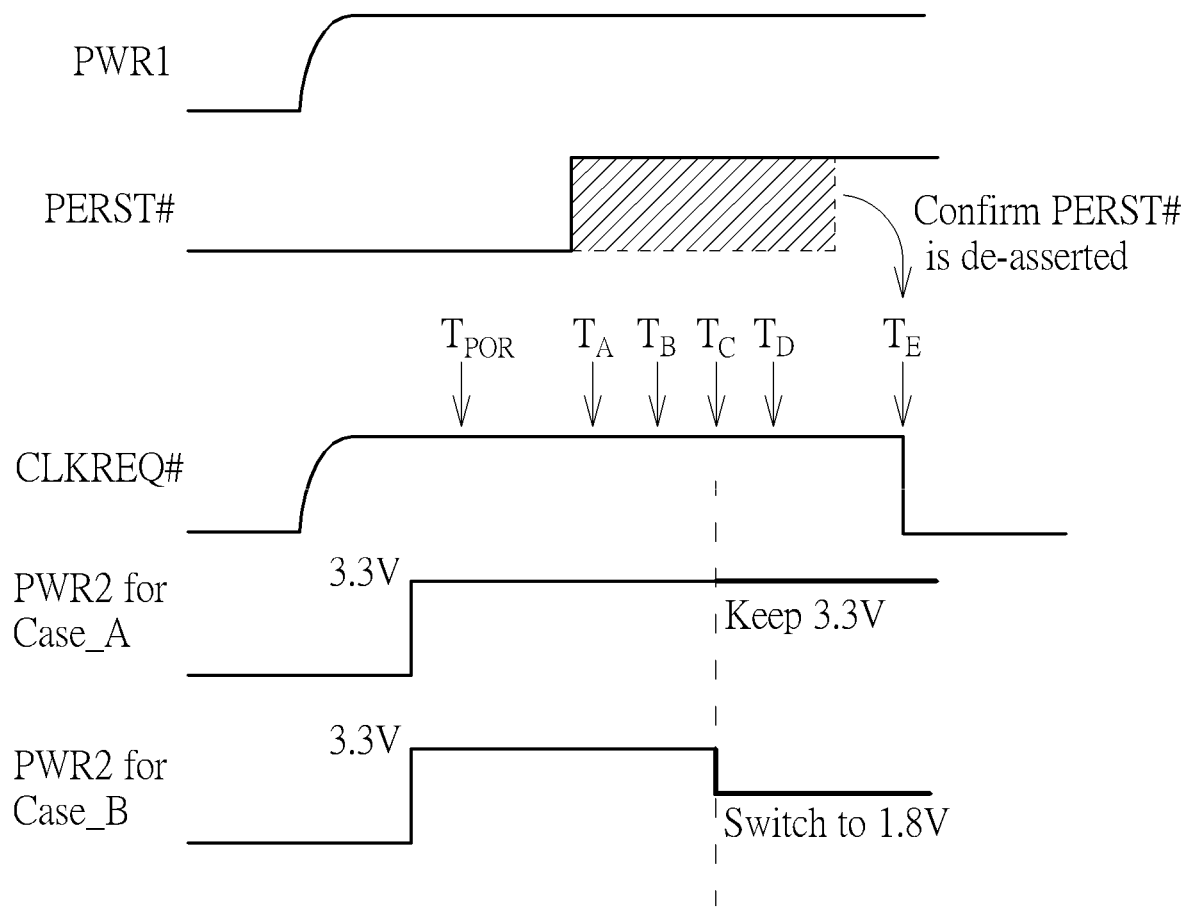
FIG. 7 illustrates some associated signals according to an embodiment of the present invention.

FIG. 7 illustrates some associated signals such as the main power voltage PWR1, the reset signal PERST#, the reference clock request signal CLKREQ#, and the secondary power voltage PWR2 for different cases Case_A and Case_B according to an embodiment of the present invention, where the cases Case_A and Case_B may correspond to the first condition (e.g. the reference clock request signal CLKREQ# is at the first predetermined voltage level such as 3.3 V) and the second condition (e.g. the reference clock request signal CLKREQ# is at the second predetermined voltage level such as 1.8 V), respectively, but the present invention is not limited thereto. For example, the memory device 100 (e.g. the memory controller 110) may perform some associated operations at a series of time points $T_A$, $T_B$, $T_C$, $T_D$, and $T_E$. The time point $T_{POR}$ may represent the time for perming power-on reset (POR). At the time point $T_A$, after the POR is ready, the comparator 230 may have become active to compare signal levels, and more particularly, compare the divided voltage V1 with a predetermined reference voltage level Compare_Voltage to generate the comparison result. At the time point $T_B$, after the comparison of the comparator 230 is completed, the latch device 250 may latch the comparator output signal carrying the comparison result, and more particularly, latch the comparison result as the latched result and generate the latch output signal carrying the latched result. At the time point $T_C$, implementation of setting the logic values 1 or 0 for the SRC 118S may vary. For example, in a situation the logic unit 260 bypasses the logic values 1 or 0 of the latch output signal, the apparatus (e.g. the signal level detection circuit 118D) may control the SRC 118S to switch from outputting the main power voltage PWR1 (e.g. 3.3 V) to outputting the regulated voltage (e.g. 1.8 V) for the case Case_B, or to keep outputting the main power voltage PWR1 (e.g. 3.3 V) for the case Case_A. For another example, in a situation the logic unit 260 allows the microprocessor 112 to forcibly set one of the logic values 1 and 0, the apparatus (e.g. the microprocessor 112 running the program code 112C) may read out the latched result as the reference for controlling the SRC 118S, to control the SRC 118S to switch from outputting the main power voltage PWR1 (e.g. 3.3 V) to outputting the regulated voltage (e.g. 1.8 V) for the case Case_B, or to keep outputting the main power voltage PWR1 (e.g. 3.3 V) for the case Case_A. At the time point $T_D$, as the IO power level (e.g. the voltage level of the secondary power voltage PWR2) is ready, the memory controller 110 may count the reset signal PERST# as good enough and allow it to be further used by an internal circuit thereof (e.g. one of the sub-circuits of the transmission interface circuit 118). At the time point $T_E$, as the internal circuit is ready, the memory controller 110 may confirm that the reset signal PERST# is de-asserted and drive the reference clock request signal CLKREQ# to be low. For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing automatic power control in a memory device, the memory device comprising a non-volatile (NV) memory, the NV memory comprising at least one NV memory element, the method comprising:

during an initialization phase of the memory device, performing signal level detection on a reference clock request signal to determine whether the reference clock request signal is at a first predetermined voltage level or a second predetermined voltage level, for performing the automatic power control for the memory device, wherein the reference clock request signal is received from a host device through an input output (IO) pad of a transmission interface circuit within the memory device, and the signal level detection comprises:

performing a voltage division operation on a voltage of the reference clock request signal to convert the voltage into a divided voltage;

comparing the divided voltage with a predetermined reference voltage level to generate a comparison result, wherein the comparison result indicates whether the reference clock request signal is at the first predetermined voltage level or the second predetermined voltage level; and latching the comparison result as a latched result, and generating a latch output signal carrying the latched result, for controlling a selective regulation circuit (SRC) of the transmission interface circuit through logic value setting; and according to a logic value carried by an input signal of the SRC, performing selective power control to generate a secondary power voltage according to a main power voltage, wherein the main power voltage is obtained from the host device, and the selective power control makes the secondary power voltage be either equal to the main power voltage or a regulated voltage of the main power voltage in response to the logic value carried by the input signal of the SRC.

2. The method of claim 1, further comprising:

according to a control signal within the memory device, determining whether to bypass a logic value of the latch output signal to the SRC; and in response to bypassing the logic value of the latch output signal to the SRC being determined, bypassing the logic value of the latch output signal to the SRC, for being used as the logic value carried by the input signal of the SRC.

3. The method of claim 1, further comprising:

according to a control signal within the memory device, determining whether to bypass a logic value of the latch output signal to the SRC; and in response to not bypassing the logic value of the latch output signal to the SRC being determined, replacing the logic value of the latch output signal with a new logic value carried by the control signal, for being used as the logic value carried by the input signal of the SRC.

4. The method of claim 1, wherein the selective power control comprises:

according to the logic value carried by the input signal of the SRC, determining whether to select the main power voltage as the secondary power voltage; and in response to selecting the main power voltage as the secondary power voltage being determined, selecting the main power voltage as the secondary power voltage.

5. The method of claim 1, wherein the selective power control comprises:

according to the logic value carried by the input signal of the SRC, determining whether to select the main power voltage as the secondary power voltage; and in response to not selecting the main power voltage as the secondary power voltage being determined, selecting the regulated voltage as the secondary power voltage.

6. The method of claim 1, wherein the automatic power control is performed according to the signal level detection of the reference clock request signal received through the IO pad, rather than respective signal level detection of multiple signals received from the host device through a plurality of IO pads of the transmission interface circuit.

7. The method of claim 6, wherein the selective power control comprises:
sending the secondary power voltage to an IO cell within the transmission interface circuit as IO power of the IO cell, to make the IO cell operate according to the secondary power voltage, wherein the IO pad is positioned in the IO cell.

8. The method of claim 7, wherein the selective power control comprises:
sending the secondary power voltage to a plurality of IO cells within the transmission interface circuit as IO power of the plurality of IO cells, to make the plurality of IO cells operate according to the secondary power voltage, wherein the IO cell is one of the plurality of IO cells.

9. The method of claim 1, wherein the selective power control comprises:
sending the secondary power voltage to an IO cell within the transmission interface circuit as IO power of the IO cell, to make the IO cell operate according to the secondary power voltage, wherein the IO pad is positioned in the IO cell.

10. The method of claim 9, wherein the selective power control comprises:
sending the secondary power voltage to a plurality of IO cells within the transmission interface circuit as IO power of the plurality of IO cells, to make the plurality of IO cells operate according to the secondary power voltage, wherein the IO cell is one of the plurality of IO cells.

11. A memory device, comprising:
a non-volatile (NV) memory, arranged to store information, wherein the NV memory comprises at least one NV memory element; and
a controller, coupled to the NV memory, arranged to control operations of the memory device, wherein the controller comprises:
a processing circuit, arranged to control the controller according to a plurality of host commands from a host device, to allow the host device to access the NV memory through the controller; and
a transmission interface circuit, coupled to the processing circuit, arranged to perform communications with the host device for the memory device, wherein the transmission interface circuit comprises:
an input output (IO) pad, arranged to receive a reference clock request signal from the host device;
a selective regulation circuit (SRC), arranged to perform selective power control; and
a signal level detection circuit, coupled to the IO pad and the SRC, arranged to perform signal level detection on the reference clock request signal during an initialization phase of the memory device, to determine whether the reference clock request signal is at a first predetermined voltage level or a second predetermined voltage level, for performing automatic power control for the memory device, and the signal level detection circuit comprises:
a voltage divider, arranged to perform a voltage division operation on a voltage of the reference clock request signal to convert the voltage into a divided voltage;
a comparator, coupled to the voltage divider, arranged to compare the divided voltage with a predetermined reference voltage level to generate a comparison result, wherein the comparison result indicates whether the reference clock request signal is at the first predetermined voltage level or the second predetermined voltage level; and
a latch device, coupled to the comparator, arranged to latch the comparison result as a latched result, and generate a latch output signal carrying the latched result, for controlling the SRC through logic value setting;
wherein according to a logic value carried by an input signal of the SRC, the SRC performs the selective power control to generate a secondary power voltage according to a main power voltage, wherein the main power voltage is obtained from the host device, and the selective power control makes the secondary power voltage be either equal to the main power voltage or a regulated voltage of the main power voltage in response to the logic value carried by the input signal of the SRC.

12. The memory device of claim 11, wherein the transmission interface circuit further comprises:
a logic unit, coupled between the signal level detection circuit and the SRC, wherein according to a control signal within the memory device, the logic unit determines whether to bypass a logic value of the latch output signal to the SRC, wherein:
if it is determined to bypass the logic value of the latch output signal to the SRC, the logic unit bypasses the logic value of the latch output signal to the SRC, for being used as the logic value carried by the input signal of the SRC; otherwise, the logic unit replaces the logic value of the latch output signal with a new logic value carried by the control signal, for being used as the logic value carried by the input signal of the SRC.

13. The memory device of claim 11, wherein the SRC comprises:
a regulator, arranged to perform voltage regulation on the main power voltage to generate the regulated voltage; and
a switch circuit, coupled to the signal level detection circuit and the regulator, wherein according to the logic value carried by the input signal of the SRC, the switch circuit determines whether to select the main power voltage as the secondary power voltage, wherein:
if it is determined to select the main power voltage as the secondary power voltage, the switch circuit selects the main power voltage as the secondary power voltage; otherwise, the switch circuit selects the regulated voltage as the secondary power voltage.

14. The memory device of claim 11, wherein the automatic power control is performed according to the signal level detection of the reference clock request signal received through the IO pad, rather than respective signal level detection of multiple signals received from the host device through a plurality of IO pads of the transmission interface circuit.

15. The memory device of claim 14, wherein the transmission interface circuit comprises:
an IO cell, wherein the SRC sends the secondary power voltage to the IO cell as IO power of the IO cell, to make the IO cell operate according to the secondary power voltage, wherein the IO pad is positioned in the IO cell.

16. The memory device of claim 15, wherein the transmission interface circuit comprises:
a plurality of IO cells, wherein the SRC sends the secondary power voltage to the plurality of IO cells as IO power of the plurality of IO cells, to make the plurality of IO cells operate according to the secondary power voltage, wherein the IO cell is one of the plurality of IO cells.

17. The memory device of claim 11, wherein the transmission interface circuit comprises:
an IO cell, wherein the SRC sends the secondary power voltage to the IO cell as IO power of the IO cell, to make the IO cell operate according to the secondary power voltage, wherein the IO pad is positioned in the IO cell.

18. The memory device of claim 17, wherein the transmission interface circuit comprises:
a plurality of IO cells, wherein the SRC sends the secondary power voltage to the plurality of IO cells as IO power of the plurality of IO cells, to make the plurality of IO cells operate according to the secondary power voltage, wherein the IO cell is one of the plurality of IO cells.

19. An electronic device comprising the memory device of claim 11, and further comprising:
the host device, coupled to the memory device, wherein the host device comprises:
at least one processor, arranged for controlling operations of the host device; and
a power supply circuit, coupled to the at least one processor, arranged for providing power to the at least one processor and the memory device;
wherein the memory device provides the host device with storage space.

20. A controller of a memory device, the memory device comprising the controller and a non-volatile (NV) memory, the NV memory comprising at least one NV memory element, the controller comprising:
a processing circuit, arranged to control the controller according to a plurality of host commands from a host device, to allow the host device to access the NV memory through the controller; and
a transmission interface circuit, coupled to the processing circuit, arranged to perform communications with the host device for the memory device, wherein the transmission interface circuit comprises:
an input output (IO) pad, arranged to receive a reference clock request signal from the host device;
a selective regulation circuit (SRC), arranged to perform selective power control; and
a signal level detection circuit, coupled to the IO pad and the SRC, arranged to perform signal level detection on the reference clock request signal during an initialization phase of the memory device, to determine whether the reference clock request signal is at a first predetermined voltage level or a second predetermined voltage level, for performing automatic power control for the memory device, and the signal level detection circuit comprises:
a voltage divider, arranged to perform a voltage division operation on a voltage of the reference clock request signal to convert the voltage into a divided voltage;
a comparator, coupled to the voltage divider, arranged to compare the divided voltage with a predetermined reference voltage level to generate a comparison result, wherein the comparison result indicates whether the reference clock request signal is at the first predetermined voltage level or the second predetermined voltage level; and
a latch device, coupled to the comparator, arranged to latch the comparison result as a latched result, and generate a latch output signal carrying the latched result, for controlling the SRC through logic value setting;
wherein according to a logic value carried by an input signal of the SRC, the SRC performs the selective power control to generate a secondary power voltage according to a main power voltage, wherein the main power voltage is obtained from the host device, and the selective power control makes the secondary power voltage be either equal to the main power voltage or a regulated voltage of the main power voltage in response to the logic value carried by the input signal of the SRC.

* * * * *